United States Patent
Lee et al.

(10) Patent No.: US 8,368,426 B2
(45) Date of Patent: Feb. 5, 2013

(54) LOW VOLTAGE DIFFERENTIAL SIGNAL DRIVING CIRCUIT AND DIGITAL SIGNAL TRANSMITTER

(75) Inventors: Yeong-Sheng Lee, Fremont, CA (US); Scott Kuenchir Wang, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/033,648

(22) Filed: Feb. 24, 2011

(65) Prior Publication Data

US 2012/0217999 A1    Aug. 30, 2012

(51) Int. Cl.
*H03K 19/0175* (2006.01)
(52) U.S. Cl. .................... 326/82; 326/86; 327/109
(58) Field of Classification Search ............... 326/82–83, 326/86, 115, 127; 327/108–109
See application file for complete search history.

(56) References Cited

U.S. PATENT DOCUMENTS

| | | | | |
|---|---|---|---|---|
| 6,218,884 B1* | 4/2001 | Chiu | | 327/376 |
| 6,222,388 B1* | 4/2001 | Bridgewater, Jr. | | 326/86 |
| 6,437,599 B1* | 8/2002 | Groen | | 326/63 |
| 6,552,581 B1* | 4/2003 | Gabara | | 327/108 |
| 6,590,432 B1* | 7/2003 | Wu et al. | | 327/108 |
| 6,700,403 B1* | 3/2004 | Dillon | | 326/37 |
| 6,853,220 B2* | 2/2005 | De Laurentiis et al. | | 327/108 |
| 6,977,534 B2* | 12/2005 | Radelinow | | 327/112 |
| 7,183,813 B2* | 2/2007 | Kasanyal et al. | | 327/65 |
| 7,215,156 B1* | 5/2007 | Li | | 326/115 |
| 7,256,626 B2* | 8/2007 | Nguyen et al. | | 327/112 |
| 7,579,874 B2* | 8/2009 | Chen et al. | | 326/83 |
| 7,595,661 B2* | 9/2009 | Kim | | 326/82 |
| 7,825,691 B2* | 11/2010 | Liu | | 326/83 |
| 2005/0179466 A1* | 8/2005 | Kasanyal et al. | | 326/87 |
| 2007/0063738 A1* | 3/2007 | Fischer | | 326/83 |
| 2007/0063739 A1* | 3/2007 | Kim | | 326/83 |
| 2008/0048722 A1* | 2/2008 | Suzuki | | 326/83 |
| 2008/0246511 A1* | 10/2008 | Miura et al. | | 326/83 |
| 2009/0153219 A1* | 6/2009 | Wu et al. | | 327/333 |
| 2009/0203333 A1* | 8/2009 | Jeffries et al. | | 455/91 |

* cited by examiner

*Primary Examiner* — Jason M Crawford
(74) *Attorney, Agent, or Firm* — McClure, Qualey & Rodack, LLP

(57) ABSTRACT

A low voltage differential signal (LVDS) driving circuit and a digital signal transmitter with the LVDS driving circuit are provided. The LVDS driving circuit includes a positive differential output terminal and a negative differential output terminal and a transition accelerator. A differential output signal is provided by the positive and negative differential output terminals. When the differential output signal transits from low to high, the transition accelerator couples the positive differential output terminal to a high voltage source and couples the negative differential output terminal to a low voltage source. When the differential output signal transits from high to low, the transition accelerator couples the positive differential output terminal to the low voltage source and couples the positive output terminal to the high voltage source.

7 Claims, 3 Drawing Sheets

US 8,368,426 B2

LOW VOLTAGE DIFFERENTIAL SIGNAL DRIVING CIRCUIT AND DIGITAL SIGNAL TRANSMITTER

BACKGROUND OF THE INVENTION

1. Field of the Invention

The present invention relates to a low voltage differential signal (LVDS) driving circuit, and in particular relates to improving a slew rate for an LVDS driving circuit.

2. Description of the Related Art

A low operation voltage design is generally used for saving power consumption.

However, for high speed transmission interfaces, such as a high-definition multimedia interface (HDMI), serial advanced technology attachment interface (SATA interface), peripheral component interconnect express interface (PCIE interface) and so on, the slew rate of the signals of LVDS driving circuits may be slowed down by limited operation voltage, and, transmission efficiency of these transmission interfaces is affected.

BRIEF SUMMARY OF THE INVENTION

Low voltage differential signal (LVDS) driving circuits and digital signal transmitters with the LVDS driving circuits are disclosed. The present LVDS driving circuit with a transition accelerator may enhance the slew rate (i.e. accelerate the transition) of the differential output signal and extend the operating frequency range of the LVDS driving circuit.

An LVDS driving circuit in accordance with an exemplary embodiment of the invention comprises a positive differential output terminal, a negative differential output terminal and a transition accelerator. A differential output signal is provided by the positive and negative differential output terminals. When the differential output signal transits from low to high, the transition accelerator couples the positive differential output terminal to a high voltage source, and couples the negative differential output terminal to a low voltage source. When the differential output signal transits from high to low, the transition accelerator couples the positive differential output terminal to the low voltage source, and couples the negative differential output terminal to the high voltage source.

A digital signal transmitter in accordance with an exemplary embodiment of the invention comprises the abovementioned LVDS driving circuit. The digital signal transmitter outputs the differential output signal for digital signal transmission.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments of the invention, which carry out the invention. This description is made for the purpose of illustrating the general principles of the invention and should not be taken in a limiting sense. The scope of the invention is best determined by reference to the appended claims.

Figure 1:
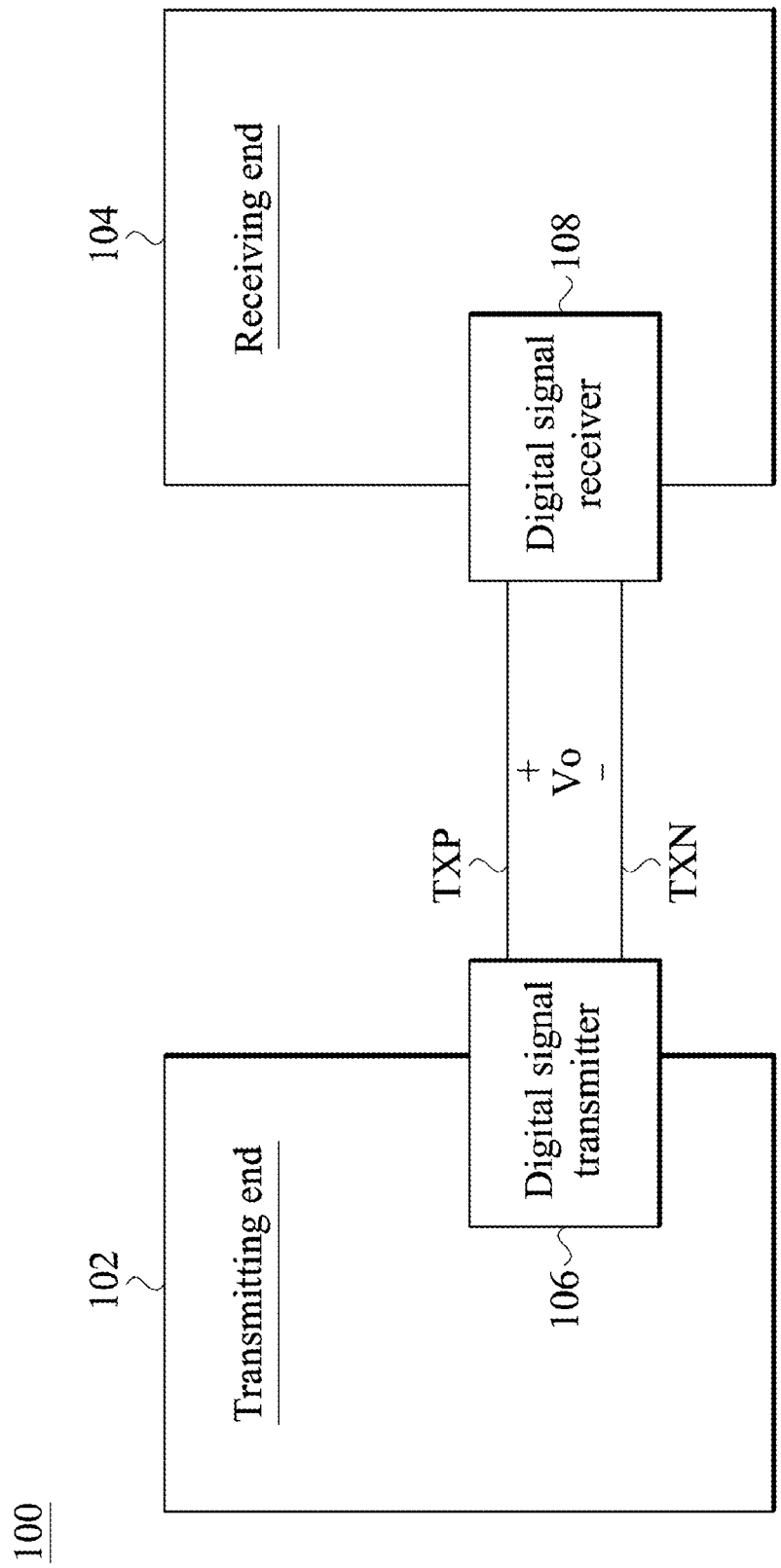
FIG. 1 illustrates an exemplary embodiment of a signal transceiving structure.

FIG. 1 illustrates an exemplary embodiment of a signal transceiving structure. The signal transceiving system 100 comprises a transmitting end 102 and a receiving end 104. The transmitting end 102 comprises a digital signal transmitter 106. The receiving end 104 comprises a digital signal receiver 108. The digital signal transmitter 106 utilizes a positive differential output TXP and a negative differential output TXN to provide a differential output signal Vo for digital signal transmission. The digital signal receiver 108 receives the positive differential output TXP and the negative differential output TXN from the digital signal transmitter 106, and utilizes a comparator to compare the received signals and thereby converts the differential output signal Vo to a digital format.

The signal transceiving structure 100 may be realized by various digital signal transmission interfaces, such as an HDMI interface, SATA interface, USB interface, PCIE interface and so on.

To generate and to drive the positive and negative differential outputs TXP and TXN, low voltage differential signal (LVDS) driving circuits are introduced.

Figure 2:
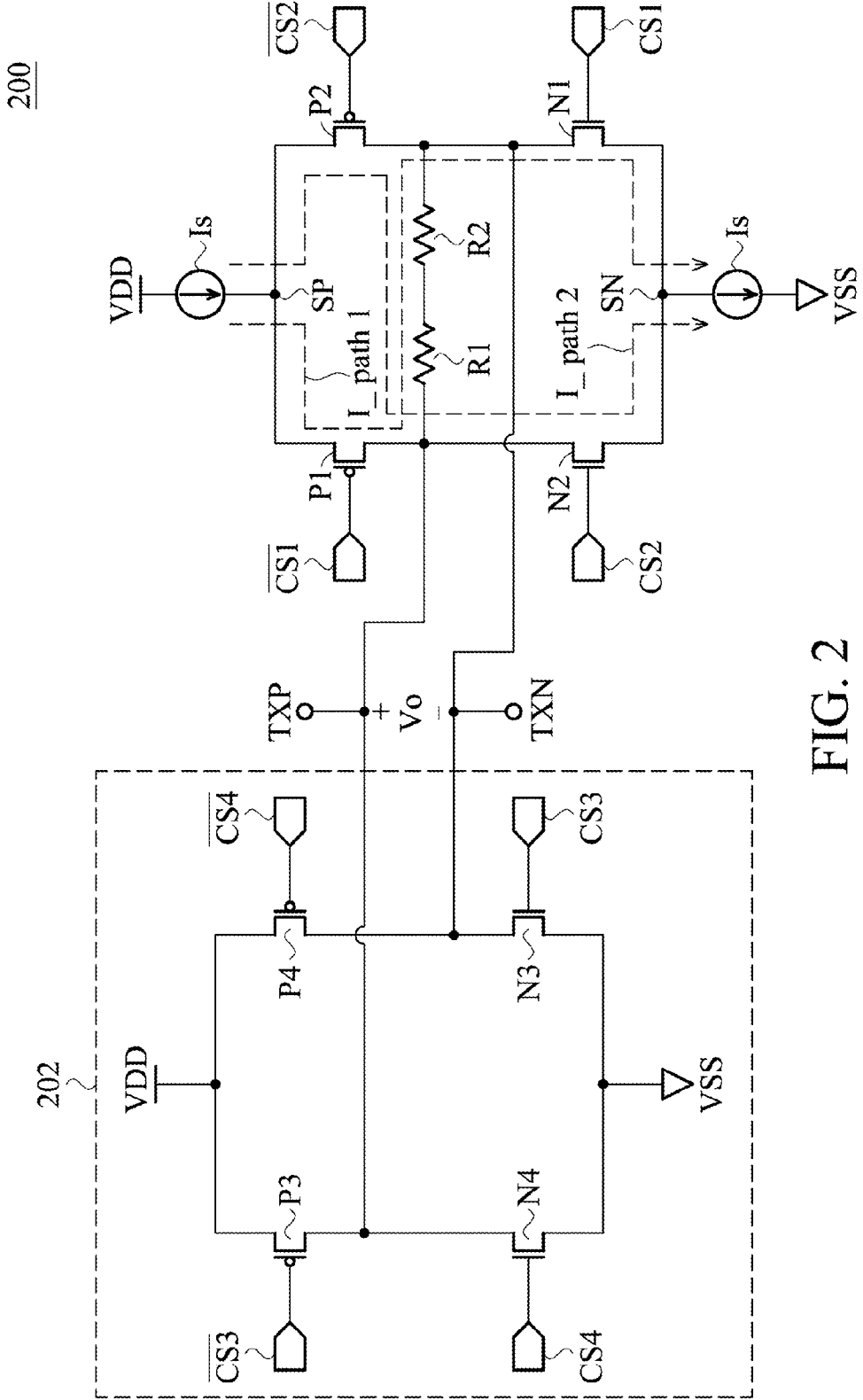
FIG. 2 illustrates an LVDS driving circuit 200 in accordance with an exemplary embodiment of the invention.

FIG. 2 illustrates an LVDS driving circuit 200 in accordance with an exemplary embodiment of the invention. The LVDS driving circuit 200 comprises a positive differential output terminal (labeled as TXP as well) and a negative differential output terminal (labeled as TXN as well), for providing the differential output signal Vo. The LVDS driving circuit 200 further comprises a transition accelerator 202, responding to the transition of the differential output signal Vo for the transition acceleration of the differential output signal Vo. The operations of the transition accelerator 202 are discussed in the following. When the differential output signal Vo transits from low to high, the transition accelerator 202 couples the positive differential output terminal TXP to a high voltage source VDD, and couples the negative differential output terminal TXN to a low voltage source VSS. When the differential output signal Vo transits from high to low, the transition accelerator 202 couples the positive differential output terminal TXP to the low voltage source VSS, and couples the negative differential output terminal TXN to the high voltage source VDD. In this manner, the transition of the differential output signal Vo is maintained at a proper speed without being affected by low operation voltage design.

The following paragraphs describe the details of the LVDS driving circuit 200.

In this embodiment, the circuit 200 comprises an impedance element (formed by the resistors R1 and R2 in this embodiment) and two current path generation circuits (discussed later). The impedance element (formed by R1 and R2) is coupled between the positive differential output terminal TXP and the negative differential output terminal TXN. The two current path generation circuits are enabled alternatively to form a first current path I_path1 and a second current path I_path2, respectively, to allow the currents to flow through the impedance element (formed by R1 and R2) in different directions. In this manner, the transition of the differential output signal Vo provided between the positive differential output terminal TXP and the negative differential output terminal TXN is controlled. The current through the first current path I_path1 and the second current path I_path2 is provided by a first current source coupled to the high voltage source VDD and a second current source coupled to the low voltage source VSS (in FIG. 2, both of the first and second current sources are labeled as Is). The first and second current sources (Is) are coupled to each other by one of the first and second current paths I_path1 and I_path2. In this embodiment of FIG. 2, the first current source Is coupled to the high voltage source VDD provides a connection node SP while the second current source Is coupled to the low voltage source VSS provides a connection node SN. The connection nodes SP and SN are coupled to each other by the first current path I_path1 or the second current path I_path2.

This paragraph discusses the first current path generation circuit which establishes the first current path I_path1. The first current path generation circuit comprises a first current path control switch and a second current path control switch. In the exemplary embodiment of FIG. 2, the first current path control switch is implemented by a P-channel device P1, and the second current path control switch is implemented by a N-channel device N1. The first current path control switch P1 is coupled between the connection node SP and the positive differential output terminal TXP, and is controlled by an inverted first control signal $\overline{CS1}$ (inverted from a first control signal CS1). The second current path control switch N1 is coupled between the negative differential output terminal TXN and the connection node SN, and is controlled by the first control signal CS1. The first and second current path control switches P1 and N1 are turned on by the high level state of the first control signal CS1, to establish the first current path I_path1 to conduct a current through the impedance element (formed by R1 and R2). In this manner, a positive voltage difference is established between the positive and negative differential output terminals TXP and TXN, and the differential output signal Vo is high.

The second current path generation circuit establishing the second current path I_path2 is discussed in this paragraph. The second current path generation circuit comprises a third current path control switch and a fourth current path control switch. In the exemplary embodiment of FIG. 2, the third current path control switch is implemented by a P-channel device P2, and the fourth current path control switch is implemented by a N-channel device N2. The third current path control switch P2 is coupled between the connection node SP and the negative differential output terminal TXN, and is controlled by an inverted second control signal $\overline{CS2}$ (inverted from a second control signal CS2). The fourth current control switch N2 is coupled between the positive differential output terminal TXP and the connection node SN, and is controlled by the second control signal CS2. The phases of the second control signal CS2 may be opposite to that of the first control signal CS1. The third and the fourth current path control switches P2 and N2 are turned on by the high level of the second control signal CS2, and thereby the second current path I_path2 is established to conduct a current through the impedance element (formed by R1 and R2). In this manner, there is a negative voltage difference between the positive and negative differential output terminals TXP and TXN such that the differential output signal Vo is low.

In the embodiment of FIG. 2, the differential output signal Vo transits from low to high when the first control signal CS1 is switched to the enable state (high level) and the second control signal CS2 is switched to the disable state (low level), and, the differential output signal Vo transits from high to low when the first control signal CS1 is switched to the disable state and the second control signal CS2 is switched to the enable state.

This paragraph discusses the structure of the transition accelerator 202, which comprises four transition acceleration switches. In this exemplary embodiment, the first transition acceleration switch is implemented by a P-channel device P3, the second transition acceleration switch is implemented by an N-channel device N3, the third transition acceleration switch is implemented by a P-channel device P4, and the fourth transition acceleration switch is implemented by an N-channel device N4. As shown, the first transition acceleration switch P3 is operative to couple the positive differential output terminal TXP to the high voltage source VDD, and the second transition acceleration switch N3 is operative to couple the negative differential output terminal TXN to the low voltage source VSS. The first and second transition acceleration switches P3 and N3 are controlled by an inverted third control signal $\overline{CS3}$ (inverted from a third control signal CS3) and the third control signal CS3, respectively, and both of the first and second transition acceleration switches P3 and N3 are turned on when the differential output signal Vo transits from low to high. The third control signal CS3 may be switched to the enable state when the first control signal CS1 is switched to the enable state and the second control signal CS2 is switched to the disable state (i.e. the differential output signal Vo is transiting from low to high). The third transition acceleration switch P4 is operative to couple the negative differential output terminal TXN to the high voltage source VDD, and the fourth transition acceleration switch N4 is operative to couple the positive differential output terminal TXN to the low voltage source VSS. The third and fourth transition acceleration switches P4 and N4 are controlled by an inverted fourth control signal $\overline{CS4}$ (inverted from a fourth control signal CS4) and the fourth control signal CS4, respectively, and both of the third and fourth transition acceleration switches P4 and N4 are turned on when the differential output signal Vo transits from high to low. The fourth control signal CS4 may be switched to the enable state when the first control signal CS1 is switched to the disable state and the second control signal CS2 is switched to the enable state (i.e. the differential output signal Vo is transiting from high to low).

Figure 3:
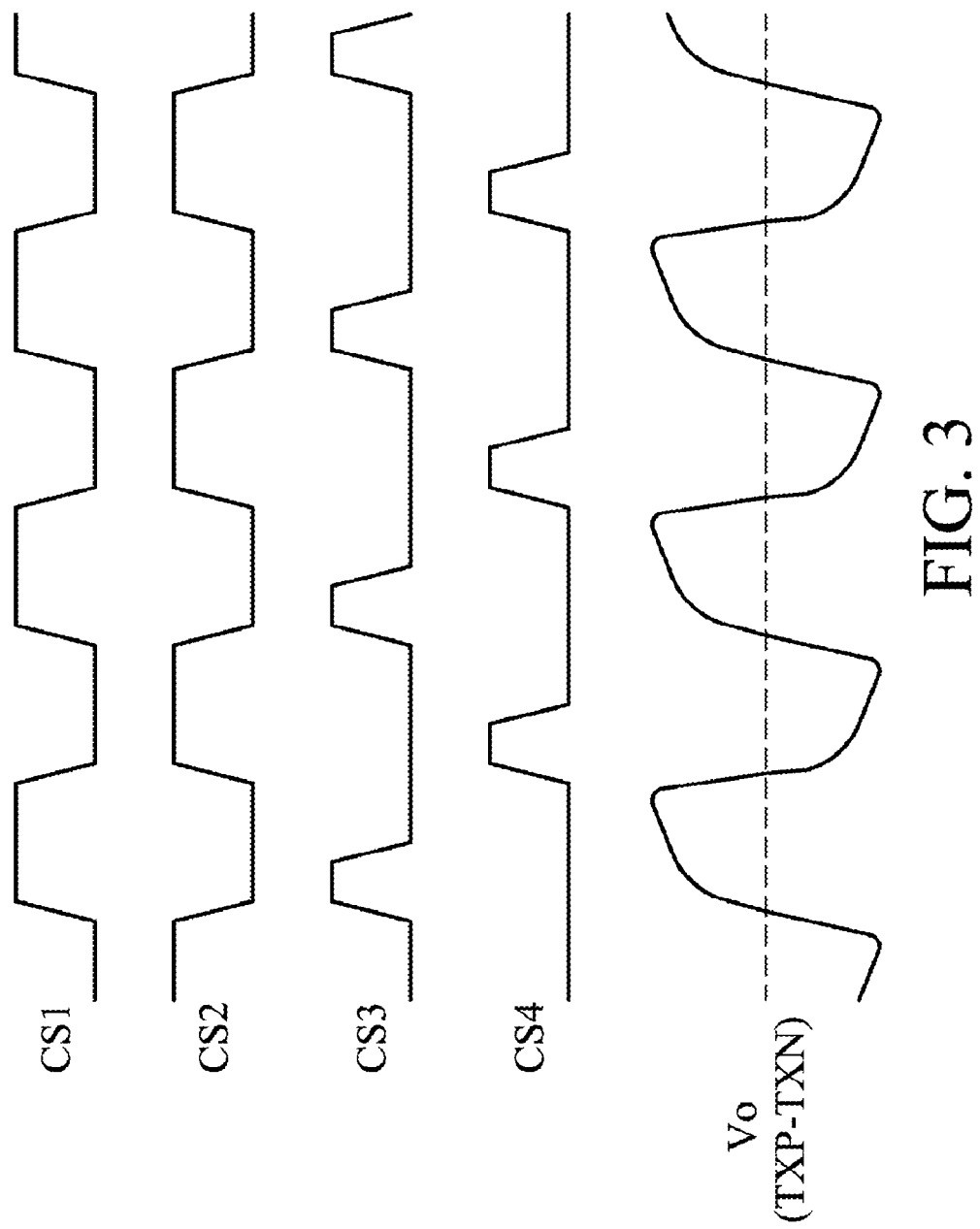
FIG. 3 shows waveforms of the first to the fourth control signals CS1 to CS4 and the differential output signal Vo (i.e. TXP-TXN).

FIG. 3 illustrates waveforms of the first to the fourth control signals CS1 to CS4 and the differential output signal Vo (TXP-TXN). As shown, the transition accelerator (controlled by the third and fourth control signals CS3 and CS4) accelerates the transition of the differential output signal Vo. Note that the enabling of the third and the fourth control signals CS3 and CS4 have to be limited within a predetermined duration which is determined in accordance with the applied transmission interface. In this manner, the conduction periods of the first to the fourth transition acceleration switches P3, N3, P4 and N4 are limited to prevent the signal transition from over acceleration, and thereby to meet the specifications of the applied transmission interface.

The transition acceleration design of the invention has good performance in a low operation voltage environment. For example, as shown in FIG. 2, the transition accelerator 202 directly acts on the two ends of the impedance element (formed by R1 and R2), and a current from the transition accelerator 202 does not flow through the first to fourth transition acceleration switch P1, N1, P2 and N2. Therefore, a RC charging time constant is less, thus it is more efficient to accelerate the transition speed of the differential output signal Vo. For at least the reasons above, the signal transition speed is not dramatically affected by the low operation voltage environment.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A low voltage differential signal driving circuit, comprising:
   a positive differential output terminal and a negative differential output terminal, providing a differential output signal and coupled to a transmission interface; and
   a transition accelerator, comprising:
   a first transition acceleration switch, turned on according to a first control signal to connect a high voltage source to the positive differential output terminal;
   a second transition acceleration switch, turned on according to an inversed signal of the first control signal to connect a low voltage source to the negative differential output terminal;
   a third transition acceleration switch, turned on according to a second control signal to connect the high voltage source to the negative differential output terminal;
   a fourth transition acceleration switch, turned on according to an inversed signal of the second control signal to connect the low voltage source to the positive differential output terminal,
   wherein:
   the first control signal is enabled to turn on the first and second transition acceleration switches in accordance with the transmission interface when the differential output signal transits from low to high; and
   the second control signal is enabled to turn on the third and fourth transition acceleration switches in accordance with the transmission interface when the differential output signal transits from high to low.

2. The low voltage differential signal driving circuit as claimed in claim 1, wherein turned-on durations of the first, second, third and fourth transition acceleration switches are limited within a predetermined time period which depends on the transmission interface.

3. The low voltage differential signal driving circuit as claimed in claim 1, further comprising:
   an impedance element, coupled between the positive and negative differential output terminals; and
   a first current path generation circuit and a second current path generation circuit, enabled alternatively to generate a first current path and a second current path, respectively, and to provide different current directions on the impedance element and thereby control transition of the differential output signal provided by the positive and negative differential output terminals.

4. The low voltage differential signal driving circuit as claimed in claim 3, further comprising:
   a first current source coupled to the high voltage source and a second current source coupled to the low voltage source, wherein the first and second current sources are coupled to each other via one of the first and the second current paths.

5. The low voltage differential signal driving circuit as claimed in claim 4, wherein the first current path generation circuit comprises:
   a first current path control switch, coupled between the first current source and the positive differential output terminal; and
   a second current path control switch, coupled between the negative differential output terminal and the second current source; and
   wherein the second current path generation circuit comprises:
   a third current path control switch, coupled between the first current source and the negative differential output terminal; and
   a fourth current path control switch, coupled between the positive differential output terminal and the second current source.

6. The low voltage differential signal driving circuit as claimed in claim 5, wherein:
   the first and second current path control switches are switched on and the third and fourth current path control switches are switched off when transiting the differential output signal from low to high; and
   the third and fourth current path control switches are switched on and the first and second current path control switches are switched off when transiting the differential output signal from high to low.

7. A digital signal transmitter, comprising:
   a low voltage differential signal driving circuit, comprising:
   a positive differential output terminal and a negative differential output terminal, providing a differential output signal and coupled to a transmission interface; and
   a transition accelerator, comprising:
   a first transition acceleration switch, turned on according to a first control signal to connect a high voltage source to the positive differential output terminal;
   a second transition acceleration switch, turned on according to an inversed signal of the first control signal to connect a low voltage source to the negative differential output terminal;
   a third transition acceleration switch, turned on according to a second control signal to connect the high voltage source to the negative differential output terminal;
   a fourth transition acceleration switch, turned on according to an inversed signal of the second control signal to connect the low voltage source to the positive differential output terminal,
   wherein:
   the first control signal is enabled to turn on the first and second transition acceleration switches in accordance with the transmission interface when the differential output signal transits from low to high;
   the second control signal is enabled to turn on the third and fourth transition acceleration switches in accordance with the transmission interface when the differential output signal transits from high to low; and
   the digital signal transmitter outputs the differential output signal to implement digital signal transmission.

* * * * *